(12) United States Patent
Huang et al.

(10) Patent No.: US 12,183,807 B2
(45) Date of Patent: Dec. 31, 2024

(54) SEMICONDUCTOR DEVICE AND METHOD FOR MANUFACTURING THE SAME

(71) Applicants: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

(72) Inventors: Weixing Huang, Beijing (CN); Huilong Zhu, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 405 days.

(21) Appl. No.: 17/783,624

(22) PCT Filed: Dec. 23, 2021

(86) PCT No.: PCT/CN2021/140812
§ 371 (c)(1),
(2) Date: Jun. 8, 2022

(87) PCT Pub. No.: WO2023/108784
PCT Pub. Date: Jun. 22, 2023

(65) Prior Publication Data
US 2023/0343851 A1 Oct. 26, 2023

(30) Foreign Application Priority Data
Dec. 15, 2021 (CN) .......................... 202111535102.X

(51) Int. Cl.
H01L 29/66 (2006.01)
H01L 29/10 (2006.01)
H01L 29/78 (2006.01)

(52) U.S. Cl.
CPC .... *H01L 29/66545* (2013.01); *H01L 29/1033* (2013.01); *H01L 29/66666* (2013.01); *H01L 29/7827* (2013.01)

(58) Field of Classification Search
CPC .......... H01L 29/66545; H01L 29/1033; H01L 29/66666; H01L 29/7827; H01L 29/1037;
(Continued)

(56) References Cited

U.S. PATENT DOCUMENTS 10,079,308 B1 * 9/2018 Pandey ............ H01L 29/66742
2007/0082448 A1 4/2007 Kim et al.
(Continued)

FOREIGN PATENT DOCUMENTS

CN 107134491 A 9/2017
CN 113594170 A 11/2021

OTHER PUBLICATIONS

ISA State Intellectual Property Office of the People's Republic of China, International Search Report and written opinion Issued in Application No. PCT/CN2021/140812, Jul. 28, 2022, WIPO, 11 pages.

*Primary Examiner* — Mohammad M Hoque
(74) *Attorney, Agent, or Firm* — Kilpatrick Townsend & Stockton LLP

(57) ABSTRACT

A semiconductor device and a method for manufacturing the same. A first electrode layer, a semiconductor layer, and a second electrode layer are formed on a substrate. The semiconductor layer is etched form a sidewall to form a cavity. A channel layer is formed at the cavity and sidewalls of the first electrode layer and the second electrode layer.

(Continued)

The channel layer includes a first channel part located in the cavity and a second channel part located outside the cavity. The first channel part is filled with a dummy gate layer. The dummy gate layer is etched from a sidewall. The second channel part and the first channel part, which is in contact with upper and lower surfaces of the dummy gate layer are removed to form a recess. The recess is filled with a dielectric material to form an isolation sidewall.

13 Claims, 11 Drawing Sheets

(58) Field of Classification Search
CPC .............. H01L 29/1054; H01L 29/165; H01L 29/7391; H01L 29/4232
USPC ......................................................... 257/288
See application file for complete search history.

(56) References Cited

U.S. PATENT DOCUMENTS

2021/0175356 A1  6/2021  Zhu
2021/0328053 A1  10/2021  Zhu

* cited by examiner

SEMICONDUCTOR DEVICE AND METHOD FOR MANUFACTURING THE SAME

The present application is the national phase of International Application No. PCT/CN2021/140812, titled "SEMICONDUCTOR DEVICE AND METHOD FOR MANUFACTURING THE SAME", filed on Dec. 23, 2021, which claims priority to Chinese Patent Application No. CN202111535102.X, titled "SEMICONDUCTOR DEVICE AND METHOD FOR MANUFACTURING THE SAME", filed on Dec. 15, 2021 with the China National Intellectual Property Administration, which is incorporated herein by reference in its entirety.

FIELD

The present disclosure relates to the field of semiconductor devices, and in particular to a semiconductor device and a method for manufacturing the semiconductor device.

BACKGROUND

Vertical semiconductor devices arouse extensive attention with rapid development of semiconductor technology. A channel current of the vertical semiconductor device flows along a direction perpendicular to a plane in which the substrate is located. The vertical semiconductor devices are advantageous in reducing power consumption, improving a scale of tiny devices, and increasing integration density of integrated circuits.

Rapid development of computer technology and the like brings a growing demand for vertical semiconductor devices of high performances. Currently, high-performance semiconductor devices are urgently needed.

SUMMARY

In view of the above, embodiments of the present disclosure provide a semiconductor device and a method for manufacturing the semiconductor device. Accordingly, a performance of vertical semiconductor devices is improved.

In order to achieve the above, the following are provided according to embodiments of the present disclosure.

A method for manufacturing a semiconductor device is provided according to an embodiment of the present disclosure. The method includes: forming a first electrode layer, a semiconductor layer including at least germanium, and a second electrode layer at a side of a substrate in the above-listed sequence, where the first electrode layer serves as one of a source layer and a drain layer, and the second electrode layer serves as another of the source layer and the drain layer; removing a part of the semiconductor layer through etching a sidewall of the semiconductor layer to form a cavity, where the cavity includes a concave facing a distal side; forming a channel layer at the cavity, a sidewall of the first electrode layer, and a sidewall of the second electrode layer, where the channel layer includes a first channel part located in the cavity and a second channel part located outside the cavity, and the first channel part is conformed to the cavity; filling the first channel part with a dummy gate layer, where a sidewall of the dummy gate layer is flush with a sidewall of the second channel part; removing a part of the dummy gate layer through etching the sidewall of the dummy gate layer, where a sidewall of the etched dummy gate layer is flush with the sidewall of the first electrode layer; removing the second channel part and the first channel part that is in contact with an upper surface and a lower surface of the dummy gate layer to form a recess, where the recess is formed by either the first electrode layer or the second electrode layer, the channel layer, and the dummy gate layer; and filling the recess with a dielectric material to form an isolation sidewall.

In an embodiment, the cavity includes a first cavity and a second cavity. The first cavity is located at a distal side of the second cavity. The channel layer includes a first sub-channel layer and a second sub-channel layer. The first sub-channel layer is located at a distal side of the second sub-channel layer. Removing the part of the semiconductor layer through etching the sidewall of the semiconductor layer includes: removing the part of the semiconductor layer through atomic etching on a distal sidewall of the semiconductor layer, to form the first cavity including the concave facing a distal side. Forming the channel layer at the cavity, the sidewall of the first electrode layer, and the sidewall of the second electrode layer includes: growing the first sub-channel layer at the first cavity, a proximal sidewall of the first electrode layer, and a proximal sidewall of the second electrode layer through epitaxy. Removing the part of the semiconductor layer through etching the sidewall of the semiconductor layer includes: removing a part of the etched semiconductor layer through atomic etching on a proximal sidewall of the semiconductor layer, to form the second cavity including a convex, where the convex is conformed to the concave. Forming the channel layer at the cavity, the sidewall of the first electrode layer, and the sidewall of the second electrode layer includes: growing the second sub-channel layer at the second cavity, a proximal sidewall of the first electrode layer, and a proximal sidewall of the second electrode layer through epitaxy.

In an embodiment, the dummy gate layer includes a first dummy gate layer and a second dummy gate layer, and the first dummy gate layer is located at a distal side of the second dummy gate layer. The recess includes a first recess and a second recess, and the first recess is located at a distal side of the second recess. Filling the first channel part with the dummy gate layer includes: filling the first channel part at the first cavity with the first dummy gate layer, and filling the first channel part at the second cavity with the second dummy gate layer. Removing the part of the dummy gate layer through etching the sidewall of the dummy gate layer includes: removing a part of the first dummy gate layer and a part of the second dummy gate layer through isotropic etching on a sidewall of the first dummy gate layer and a sidewall of the second dummy gate layer. Removing the second channel part and the first channel part that is in contact with the upper surface and the lower surface of the dummy gate layer includes: removing the second channel part in the first sub-channel layer and the first channel part that is in contact with an upper surface and a lower surface of the first dummy gate layer through atomic layer etching to form the first recess, where the first recess is formed by either the first electrode layer or the second electrode layer, the first sub-channel layer, and the first dummy gate layer; and removing the second channel part in the second sub-channel layer and the first channel part that is in contact with an upper surface and a lower surface of the second dummy gate layer through atomic layer etching to form the second recess, where the second recess is formed by either the first electrode layer or the second electrode layer, the second sub-channel layer, and the second dummy gate layer. Filling the recess with the dielectric material includes: depositing the dielectric material in the first recess and the second recess to form the isolation sidewall.

In an embodiment, before removing the part of the etched semiconductor layer through atomic layer etching on the proximal sidewall of the semiconductor layer, the method further includes: forming an opening running through the first electrode layer, the semiconductor layer, and the second electrode layer, where the opening is surrounded by a fence structure formed from the first electrode layer, the semiconductor layer, and the second electrode layer.

In an embodiment, before removing the part of the semiconductor layer through etching the sidewall of the semiconductor layer, the method further includes: forming an etch-stop layer, a silicon layer, and a dielectric layer on the second electrode layer in the above-listed sequence; processing the silicon layer and the dielectric layer to form a top structure, where the top structure includes a silicon core region and a dielectric barrier surrounding the silicon core region, and the silicon core region corresponds to the opening. Forming the opening running through the first electrode layer, the semiconductor layer, and the second electrode layer includes: forming the opening running through the dielectric barrier, the silicon core region, the etch-stop layer, the first electrode layer, the semiconductor layer, and the second electrode layer, where the fence structure is formed from the dielectric barrier, the etch-stop layer, the first electrode layer, the semiconductor layer, and the second electrode layer.

In an embodiment, after filling the recess with the dielectric material to form the isolation sidewall, the method further includes: removing the dummy gate layer, and forming a gate at the first channel part.

In an embodiment, before forming the gate at the first channel part, the method further includes: forming an interface layer and then a high-K material layer at the first channel part, where both the interface layer and the high-K material layer are conformed to the first channel part.

In an embodiment, the semiconductor layer including at least germanium is made of germanium or silicon germanium.

In an embodiment, the dielectric material is a low-κ material.

A semiconductor device is provided according to an embodiment of the present disclosure. The semiconductor device includes: a substrate, a first electrode layer, a functional layer and a second electrode layer that are sequentially stacked; and an opening, running through the first electrode layer, the functional layer, and the second electrode layer and reaching the substrate, where the opening is surrounded by a fence structure formed from the first electrode layer, the functional layer, and the second electrode layer. The first electrode layer is located at a side of the substrate, and the functional layer is located at a side of the first electrode layer away from the substrate. The functional layer includes a channel region, a gate region, and an isolation sidewall region. The channel region includes a concave region facing a distal side, the gate region is located at two sides of the concave region, and the isolation sidewall region is located both above and below the gate region. The second electrode layer is arranged at a side of the functional layer away from the substrate. The first electrode layer serves as one of a source layer and a drain layer, and the second electrode layer serves as another of the source layer and the drain layer.

The method for manufacturing the semiconductor device is provided according to embodiments of the present disclosure. The first electrode layer, the semiconductor layer including at least germanium, and the second electrode layer are formed at the side of the substrate in the above-listed sequence. The first electrode layer serves as one of the source layer and the drain layer, and the second electrode layer serves as another of the source layer and the drain layer. Then, the part of the semiconductor layer is removed through etching the sidewall of the semiconductor layer to form the cavity. The cavity includes the concave facing a distal side, that is, the cavity opens toward outside. Afterwards, the channel layer is formed at the cavity, the sidewall of the first electrode layer, and the sidewall of the second electrode layer. The channel layer includes the first channel part located in the cavity and the second channel part located outside the cavity, and the first channel part is conformed to the cavity, that is, the first channel part also includes a concave. The first channel part is filled with the dummy gate layer, and the sidewall of the dummy gate layer is flush with the sidewall of the second channel part. Then, the part of the dummy gate layer is removed through etching the sidewall of the dummy gate layer with the second channel part serving as a shield, and the sidewall of the etched dummy gate layer is flush with the sidewall of the first electrode layer. Afterwards, the second channel part and the first channel part, which is in contact with the upper surface and the lower surface of the dummy gate layer, are removed to form the recess. The recess is formed by either the first electrode layer or the second electrode layer, the channel layer, and the dummy gate layer. The recess is filled with the dielectric material to form the isolation sidewall. The formed isolation sidewall is capable to reduce parasitic capacitance of the semiconductor device and improve a performance of the semiconductor device.

BRIEF DESCRIPTION OF THE DRAWINGS

For clearer illustration of the embodiments of the present disclosure, hereinafter briefly described are the drawings to be applied in embodiments of the present disclosure. Apparently, the drawings in the following descriptions are only some embodiments of the present disclosure.

DETAILED DESCRIPTION

Figure 1:
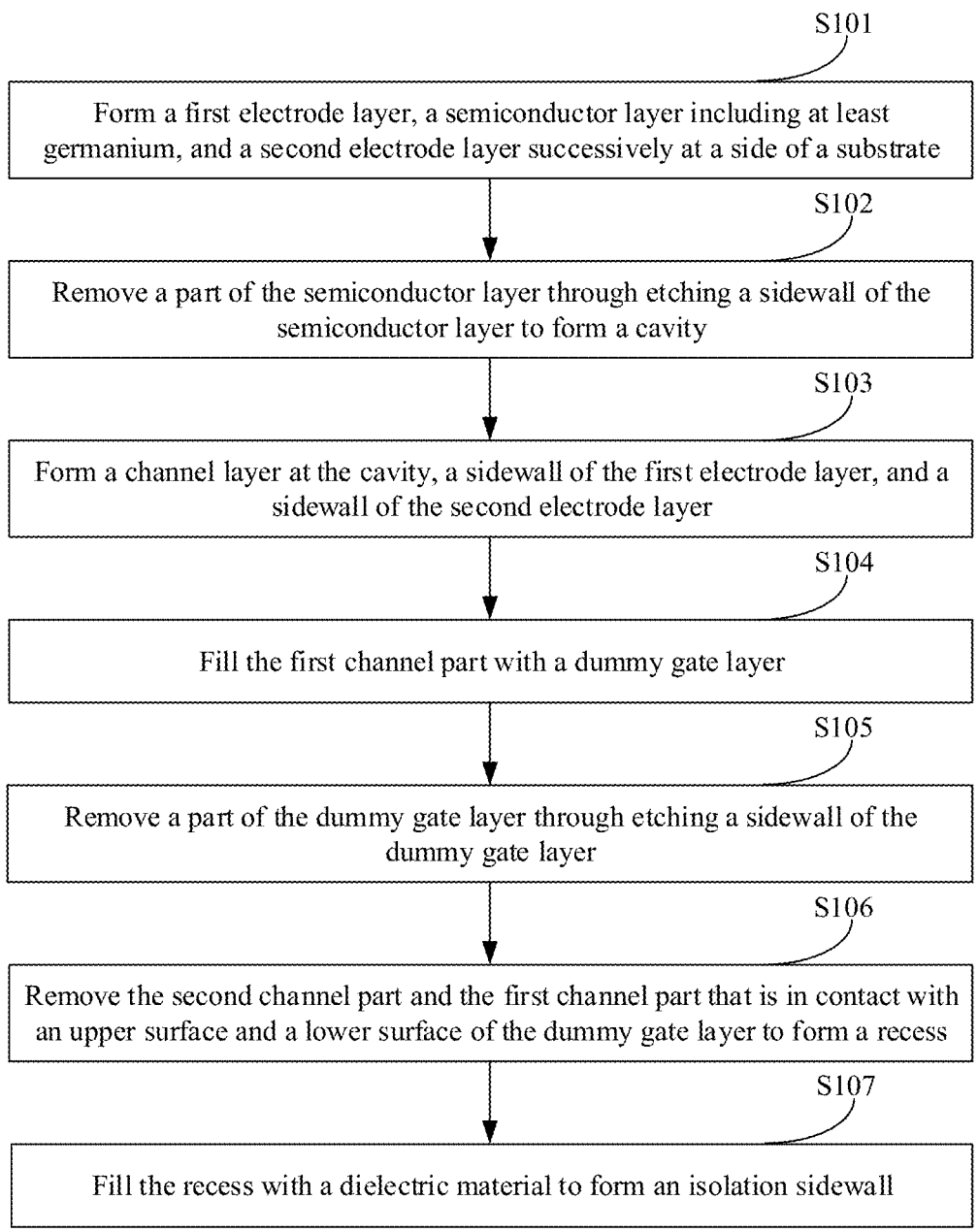
FIG. 1 is a flow chart of a method for manufacturing a semiconductor device according to an embodiment of the present disclosure.

In order to facilitate understanding of the embodiments of the present disclosure, hereinafter embodiments of the present disclosure are described in detail in conjunction with the drawings.

Various details are set forth in following description to facilitate a full understanding of the present disclosure. The present disclosure may be implemented in a manner different from those described herein. Therefore, the present disclosure is not limited by the embodiments disclosed hereinafter.

In addition, the present disclosure is described in detail in conjunction with schematic diagrams. In order to facilitate explanation, when describing embodiments of the present disclosure in detail, a cross-sectional view of a device structure may not show parts that are enlarged to scale. The schematic diagrams are only exemplary, and shall not limit the protection scope of the present disclosure. In addition, three-dimensional spatial dimensions, including a length, a width, and a depth should be considered in actual manufacturing.

Currently, there is a growing demand for vertical semiconductor device of high performances. A performance of a conventional vertical semiconductor device is affected by, for example, high parasitic capacitance. Hence, high-performance semiconductor devices are urgently needed at present.

On such basis, a method for manufacturing a semiconductor device is provided according to embodiments of the present disclosure. A first electrode layer, a semiconductor layer including at least germanium, and a second electrode layer are formed at a side of a substrate in the above-listed sequence. The first electrode layer serves as one of a source layer and a drain layer, and the second electrode layer serves as another of the source layer and the drain layer. Then, a part of the semiconductor layer is removed through etching a sidewall of the semiconductor layer to form a cavity. The cavity includes a concave facing a distal side, that is, the cavity opens toward outside. Afterwards, a channel layer is formed at the cavity, a sidewall of the first electrode layer, and a sidewall of the second electrode layer. The channel layer includes a first channel part located in the cavity and a second channel part located outside the cavity, and the first channel part is conformed to the cavity, that is, the first channel part also includes a concave. The first channel part is filled with a dummy gate layer, and a sidewall of the dummy gate layer is flush with a sidewall of the second channel part. Then, a part of the dummy gate layer is removed through etching a sidewall of the dummy gate layer with the second channel part serving as a shield, and a sidewall of the etched dummy gate layer is flush with the sidewall of the first electrode layer. Afterwards, the second channel part and the first channel part, which is in contact with an upper surface and a lower surface of the dummy gate layer, are removed to form a recess. The recess is formed by either the first electrode layer or the second electrode layer, the channel layer, and the dummy gate layer. The recess is filled with a dielectric material to form an isolation sidewall. The formed isolation sidewall is capable to reduce parasitic capacitance of the semiconductor device and improve a performance of the semiconductor device.

For better understanding technical solutions and technical effects of the present disclosure, hereinafter embodiments are described in detail in conjunction with the drawings.

A semiconductor device according to an embodiment of the present disclosure may be a memory device or a logic device. A semiconductor device according to an embodiment of the present disclosure may be a transistor device having a vertical structure, such as a vertical field effect transistor (FET). In one embodiment, the semiconductor device may be a metal-oxide-semiconductor field-effect transistor (MOSFET) or a tunneling field-effect transistor (TFET).

Reference is made to FIG. 1, which is a flow chart of a method for manufacturing a semiconductor device according to an embodiment of the present disclosure. The method includes following steps S101 to S107.

Figure 2:
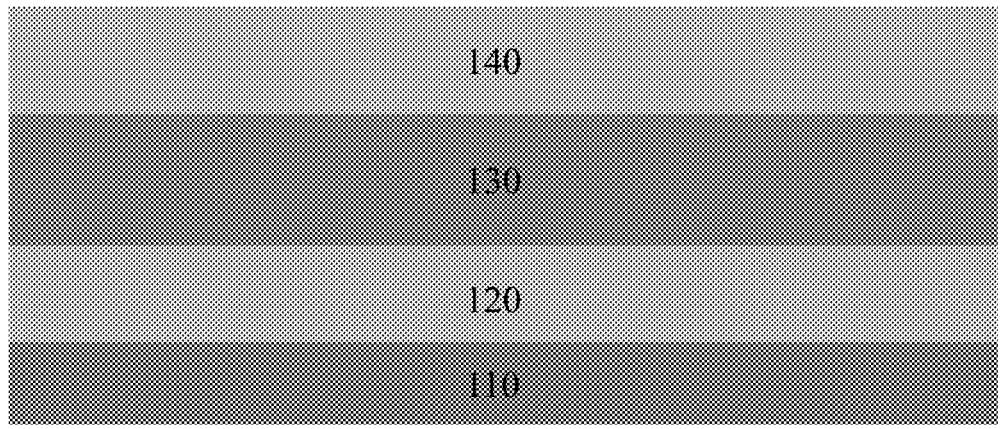
FIGS. 2 to 20 are schematic structural diagrams of a semiconductor device manufactured during a method according to an embodiment of the present disclosure.

In step S101, a first electrode layer 120, a semiconductor layer 130 including at least germanium, and a second electrode layer 140 are formed at a side of a substrate 110 in the above-listed sequence. Reference is made to FIG. 2.

In an embodiment, the first electrode layer 120, the semiconductor layer 130 including at least germanium, and the second electrode layer 140 may be sequentially formed on a surface of the substrate 110. In one embodiment, the first electrode layer 120, the semiconductor layer 130 including at least germanium, and the second electrode layer 140 may be grown through epitaxy.

The substrate 110 may be a semiconductor substrate, for example, a silicon substrate. Before the first electrode layer 120 is formed at the side of the substrate 110, the substrate 110 may be doped to form a well layer. Reference is made to FIG. 2, in which the well layer may be formed by doping the substrate 110. Compared with the substrate 110, the doped well layer has higher conductivity and can achieve good electrical contact with the first electrode layer 120. The doping may be of the n-type, and the dopant may be As or P and has a concentration ranging from $1e17$ $cm^{-3}$ to $2e19$ $cm^{-3}$. In one embodiment, the doping may be of the p-type, and the dopant may be B or In, and has a concentration ranging from $1e17$ $cm^{-3}$ to $2e19$ $cm^{-3}$. In one embodiment, the well layer may be formed on the silicon substrate through ion implantation and annealing.

In an example, the well layer is formed by injecting p-type impurities for an n-type field-effect transistor (FET), and the well layer is formed by injecting n-type impurities for a p-type field-effect transistor (FET).

In an embodiment, after the first electrode layer 120 and the second electrode layer 140 are grown through epitaxy, a thickness of the first electrode layer 120 and a thickness of the second electrode layer 140 each ranges from 10 nm to 50 nm. The first electrode layer 120 and the second electrode layer 140 are doped semiconductor layers, both of which may be n-type doped or p-type doped. The first electrode layer 120 is one of a source layer and a drain layer, and the second electrode layer 140 is another of the source layer and the drain layer. Conductivity of the first electrode layer 120 and the second electrode layer 140 can be improved due to doping. In one embodiment, the first electrode layer 120 and the second electrode layer 140 may be in-situ doped.

A p-type FET device is taken as an example. The first electrode layer 120 is a silicon layer which is p-type doped, and the dopant is B or In and has a concentration ranging from $1e18$ $cm^{-3}$ to $1e21$ $cm^{-3}$. The second electrode layer 120 which is p-type doped, and the dopant is B or In and has a concentration ranging from $1e18$ $cm^{-3}$ to $1e21$ $cm^{-3}$.

A p-type FET device is taken as another example. The first electrode layer 120 is a silicon layer which is n-type doped, and the dopant is As or P and has a concentration ranging from $1e18$ $cm^{-3}$ to $1e21$ $cm^{-3}$. The second electrode layer 120 which is n-type doped, and the dopant is As or P and has a concentration ranging from $1e18$ $cm^{-3}$ to $1e21$ $cm^{-3}$.

In an embodiment, after the first electrode layer 120 is grown through epitaxy, the semiconductor layer 130 including at least germanium may be grown on the first electrode layer 120 through epitaxy. The semiconductor layer 130 is made of at least germanium, for example, may be germanium or silicon germanium. A thickness of the semiconductor layer 130 may range from 10 nm to 100 nm.

In an embodiment, the semiconductor layer 130 is made of silicon germanium (SiGe), and a mole fraction of germanium ranges from 10% to 50%. In a case that the germanium concentration is too low, a C-shaped cavity cannot be formed. In a case that the germanium concentration is too high, there are a lot of defects in a crystal lattice, which may reduce a performance of the semiconductor device.

In an embodiment, the mole fraction of the germanium remains unchanged in a direction perpendicular to the substrate 110.

In another example, the mole fraction of the germanium increases and then decreases in a direction perpendicular to the substrate 110. That is, the germanium concentration of a middle region is greater than that of an upper region and that of a lower region. The middle region has higher germanium concentration, and the upper and lower regions have lower germanium concentration. Since an etching rate of a region having higher germanium concentration is greater than that of a region having lower germanium concentration, it is convenient to form a cavity including a concave in subsequent etching.

Figure 3:
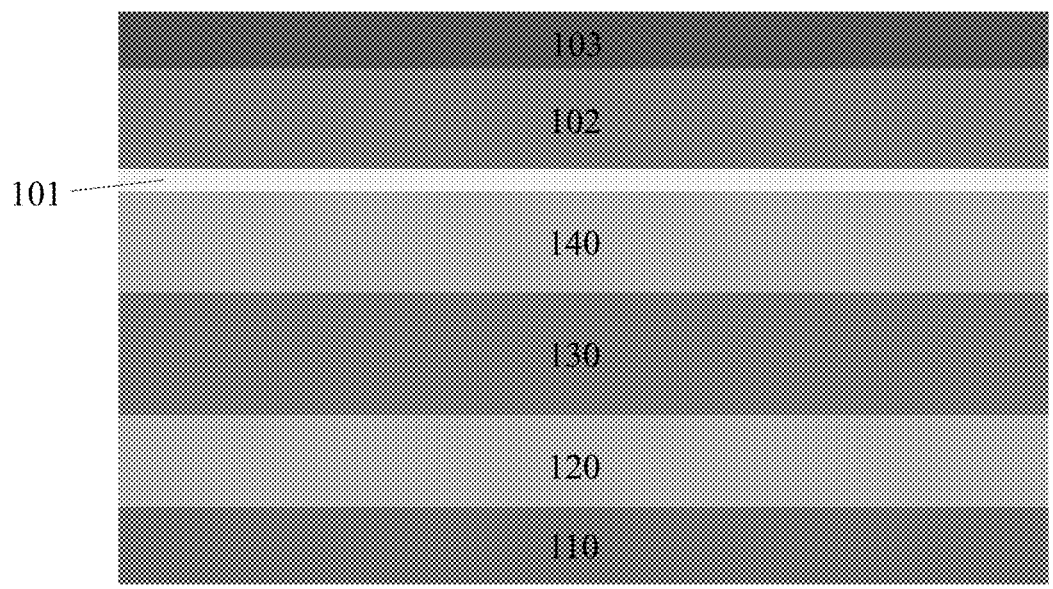

In an embodiment, after the semiconductor layer 130 is grown through epitaxy, the second electrode layer 140 is grown on the semiconductor layer 130 through epitaxy. Then, an etch-stop layer 101, a silicon layer 102, and a dielectric layer 103 are sequentially formed on the second electrode layer 140, as shown in FIG. 3. The etch-stop layer 101, the silicon layer 102, and the dielectric layer 103 may be formed through deposition.

The etch-stop layer 101 covers the second electrode 140 to protect the second electrode layer 140 located under the etch-stop layer 101. The etch-stop layer 101 may serve as a barrier in etching, and to prevent an etching process from damaging the second electrode layer 140 when forming a contact for the second electrode layer 140. The etch-stop layer 101 may be made of silicon oxide. The silicon oxide may be formed by under high temperature process and have a high crystallization quality, and to improve a performance of the semiconductor device. A thickness of the etch-stop layer 101 may range from 1 nm to 10 nm.

The etch-stop layer 101 is covered with the silicon layer 102. The silicon layer 102 may be made of polycrystalline silicon or amorphous silicon. A thickness of the silicon layer 102 may range from 50 nm to 150 nm.

The silicon layer 102 is covered with the dielectric layer 103. The dielectric layer 103 is configured to isolate the second electrode layer 140 from another film layer when manufacturing the device. The dielectric layer 103 is further configured to isolate the second contact after the contact for the second electrode layer 140, which ensures the second contact is electrically connected to only the second electrode layer 140 in the semiconductor device. The dielectric layer 103 may be made of nitride, such as silicon nitride. A thickness of the dielectric layer 103 may range from 30 nm to 100 nm.

Figure 4:
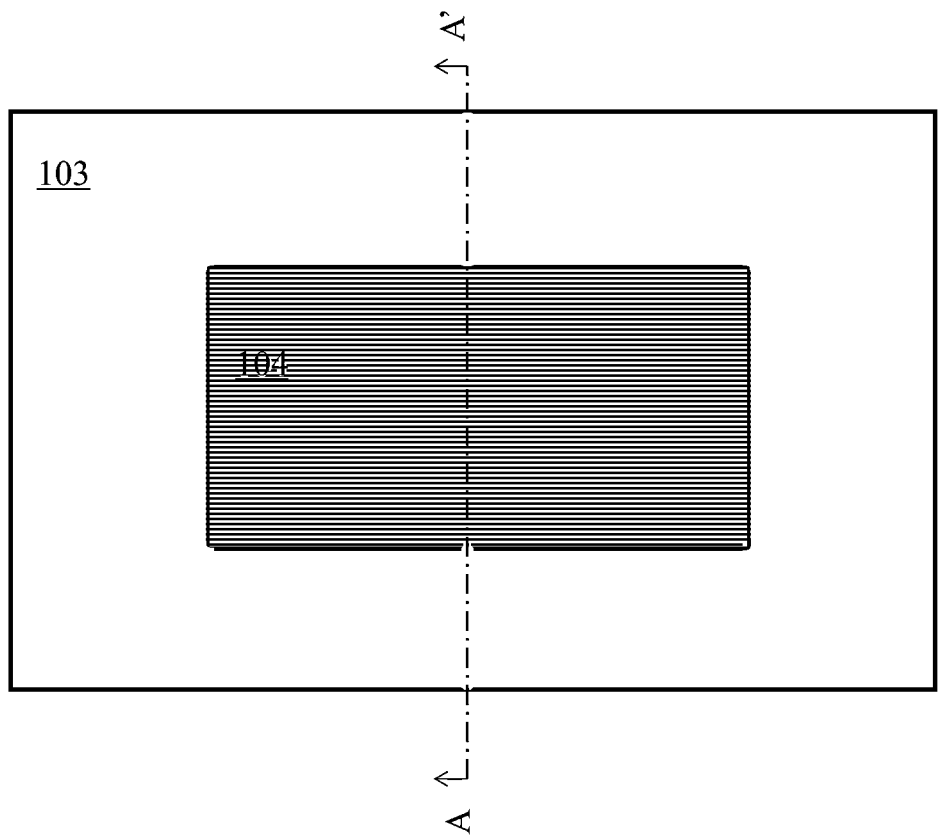

In an embodiment, after the first electrode layer 120, the semiconductor layer 130, the second electrode layer 140, the etch-stop layer 101, the silicon layer 102, and the dielectric layer 103 are sequentially formed on the substrate 110, a patterned photoresist layer 104 may further be formed on the dielectric layer 103. The patterned photoresist layer 104 defines a silicon core region 1021 of the semiconductor device. Reference is made to FIG. 4, which is a schematic structural diagram showing a top view of a semiconductor device in a manufacturing process.

Figure 5:
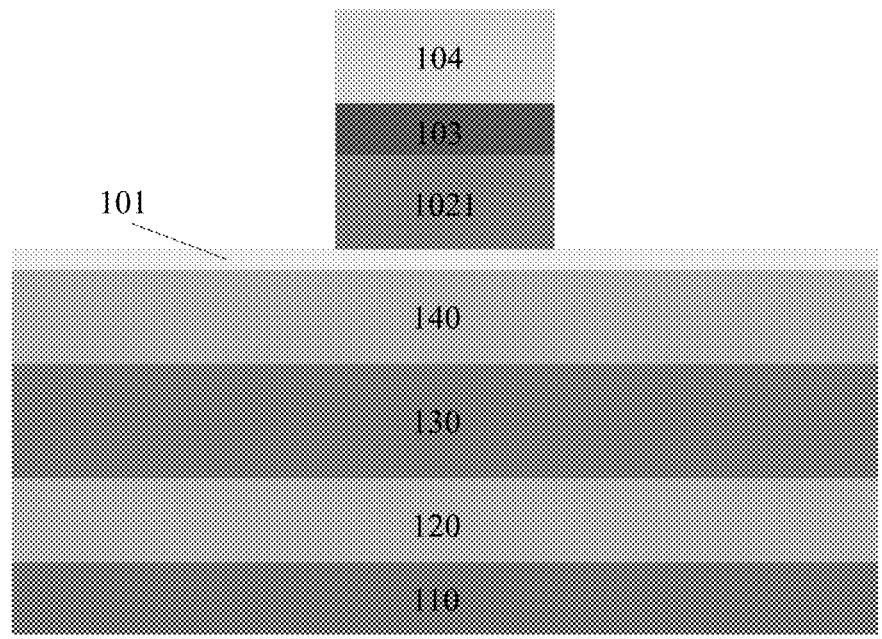
Figure 6:
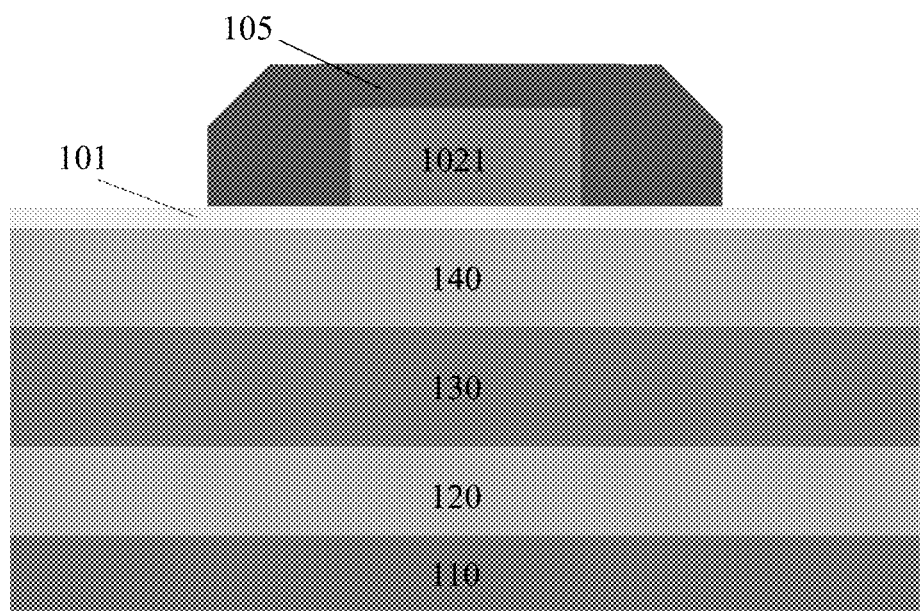

The dielectric layer 103 and the silicon layer 102 are etched via the patterned photoresist layer 104, as shown in FIG. 5. FIG. 5 is a schematic structural diagram of a cross section of the semiconductor device along direction AA'. After the dielectric layer 103 and the silicon layer 102 are etched, the photoresist layer 104 is removed, and the etched dielectric layer 103 and the silicon core region 1021 remain. A dielectric material is deposited and then etched to form a dielectric barrier 105 surrounding the silicon core region 1021, as shown in FIG. 6. That is, the silicon layer 102 and the dielectric layer 103 are processed to form a top structure, and the top structure includes the silicon core region 1021 and the dielectric barrier 105 enclosing the silicon core region 1021.

When the dielectric barrier 105 is formed through etching, it is necessary to select an etching agent having selectivity against the etch-stop layer 101, and the etch-stop layer 101 is not damaged during the etching.

Figure 7:
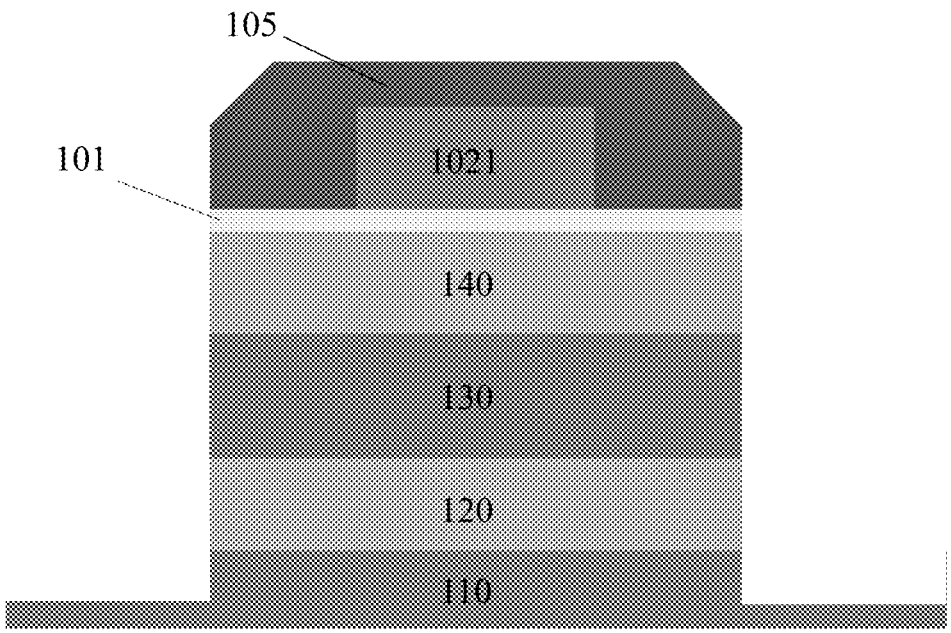
Figure 8:
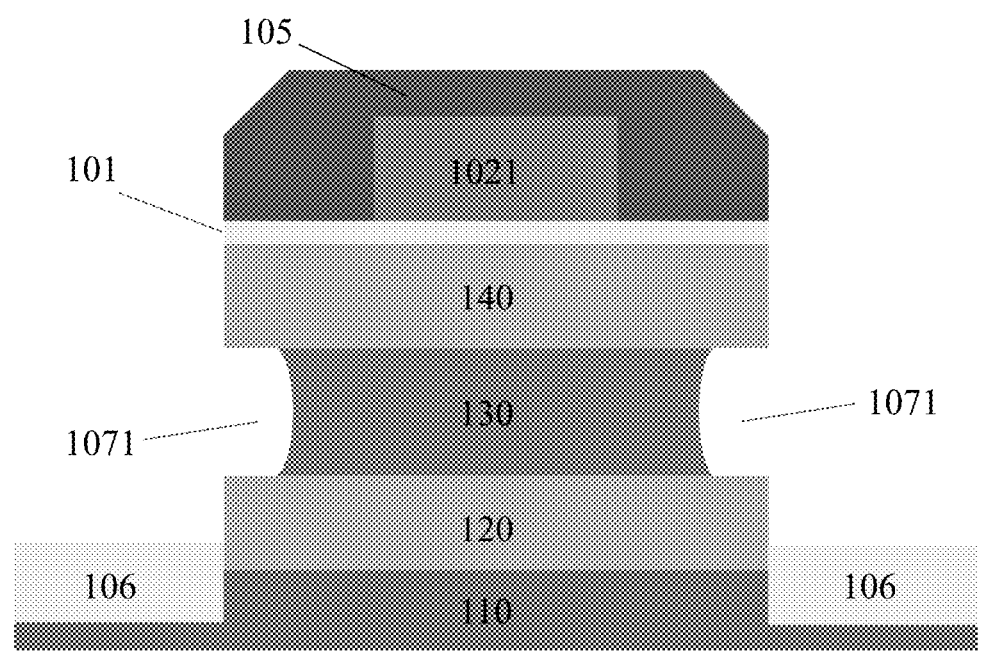

Afterwards, the dielectric barrier 105 serves as a mask, and the etch-stop layer 101, the second electrode layer 140, the semiconductor layer 130, the first electrode layer 120 and a part of the substrate 110 are etched, as shown in FIG. 7. After the etch-stop layer 101, the second electrode layer 140, the semiconductor layer 130, the first electrode layer 120, and a part of the substrate 110 are etched, a dielectric material is deposited to cover the semiconductor device completely and then subject to chemical mechanical polishing (CMP) and etching, and to form a shallow trench isolation (STI) layer 106. Reference is made to FIG. 8. The STI layer 106 is configured to isolate the semiconductor device from another semiconductor device which is simultaneously formed when manufacturing an integrated circuit. The dielectric material may be silicon oxide. The etching may be wet etching or dry etching.

Figure 13:
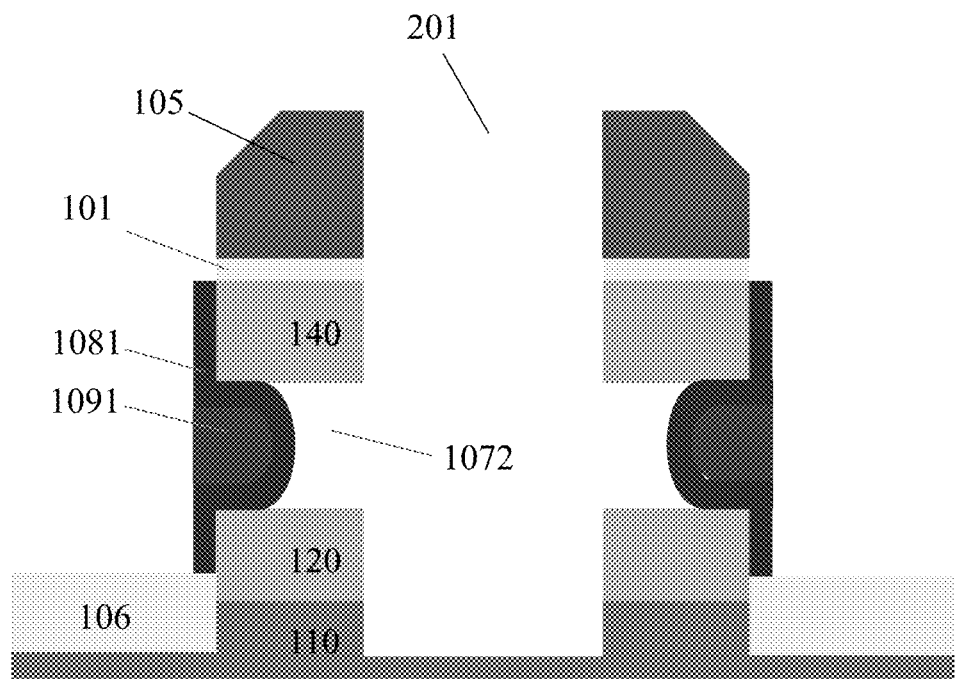

In step S102, a part of the semiconductor layer 130 is removed through etching a sidewall of the semiconductor layer 130 to form a cavity. Reference is made to FIGS. 8 and 13.

In an embodiment, after the etch-stop layer 101, the second electrode layer 140, the semiconductor layer 130, the first electrode layer 120, and the part of the substrate 110 are etched, the part of the semiconductor layer 130 is removed through etching the sidewall of the semiconductor layer 130 to form the cavity. The cavity includes a concave, and the concave faces outward.

In an embodiment, the cavity includes a first cavity 1071 and a second cavity 1072. The first cavity 1071 is located at a distal side of the second cavity 1072.

As shown in FIG. 8, the part of the semiconductor layer 130 is removed through etching an outer sidewall of the semiconductor layer 130 to form the first cavity 1071, which includes the concave. The concave in the first cavity 1071 faces a distal side. The first cavity 1071 including the concave has a shape similar to the letter "C". The concave cavity facilitates forming a concave channel layer in the cavity in a subsequent step. Such channel layer provides a small leakage current and a long channel length, and hence improves a performance of the semiconductor device.

After the etching, a width of the remained semiconductor layer 130 decreases gradually and then increases gradually along a direction perpendicular to the substrate 110. That is, the remained semiconductor layer 130 has a structure in which both a width of an upper part and a width of a lower part are greater than a width of a middle part. Such structure has a shape similar to the letter "X".

In a case that the semiconductor layer 130 is made of silicon germanium or germanium, the semiconductor layer 130 is etched by 10 nm to 40 nm from the sidewall through atomic layer etching, and to form the C-shaped cavity 1071. When etching the semiconductor layer 130, an etching agent having selectivity against the first electrode layer 120 and the second electrode layer 140 is selected, and the first electrode layer 120 and the second electrode layer 140 are not damaged when forming the cavity 1071 through etching.

In an embodiment, the remained semiconductor layer 130 is further etched from an inner sidewall of the semiconductor layer 130, as shown in FIG. 13, to form the second cavity 1072 including a convex. The convex in the second cavity 1072 is conformed to the concave in the first cavity 1071. That is, the convex in the second cavity 1072 faces a proximal side. The second cavity 1072 including the concave also has a shape similar to the letter "C". A process of forming the second cavity 1072 would be illustrated in detail after following description concerning filling the first cavity 1071 with the channel layer and a dummy gate layer.

Figure 9:
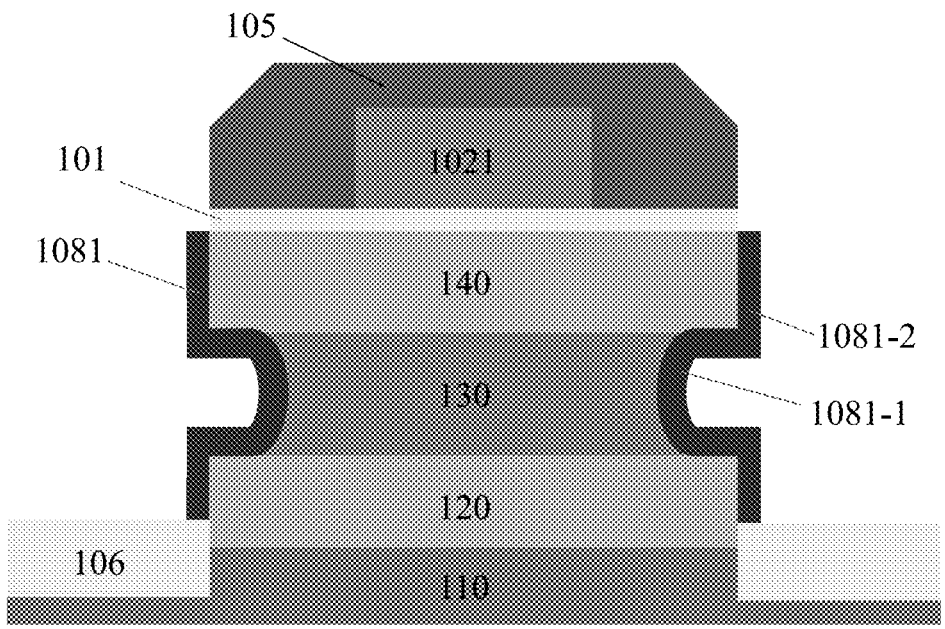
Figure 14:
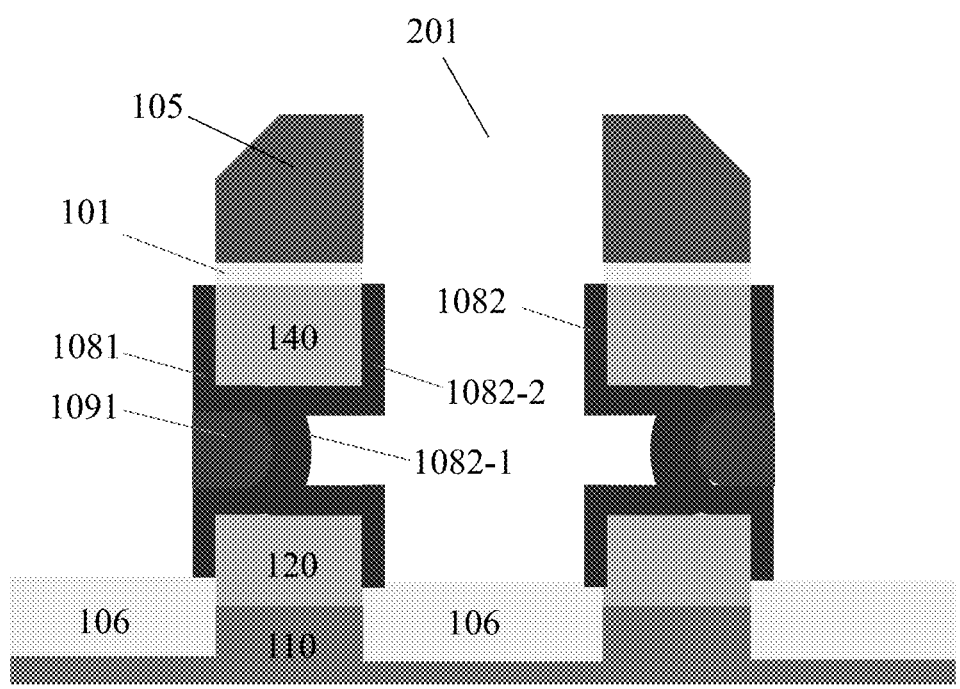

In step S103, the channel layer is formed at the cavity, a sidewall of the first electrode layer 120 and a sidewall of the second electrode layer 140. Reference is made to FIGS. 9 and 14.

In an embodiment, after the cavity is formed through etching, the channel layer may be formed at the cavity, the sidewall of the first electrode layer 120, and the sidewall of the second electrode layer 140. The channel layer includes a first sub-channel layer 1081 and a second sub-channel layer 1082. The first sub-channel layer 1081 is located at a distal side of the second sub-channel layer 1082. The channel layer includes a first channel part located in the cavity and a second channel part located outside the cavity. The first channel part is conformed to the cavity.

As shown in FIG. 9, the first sub-channel layer 1081 is grown at the first cavity 1071, an outer sidewall of the first electrode layer 120 and an outer sidewall of the second electrode layer 140 through epitaxy. The first sub-channel layer 1081 includes a first channel part 1081-1 located in the first cavity 1071 and a second channel part 1081-2 located outside the first cavity 1071. The first channel part 1081-1 is conformed to the first cavity 1071, that is, the first channel part 1081-1 also includes a concave facing the distal side.

A thickness of the channel layer may range from 3 nm to 30 nm. The channel layer is made of silicon or silicon germanium. In a case that the channel layer is made of silicon germanium, the mole fraction of germanium ranges from 10% to 50%.

As shown in FIG. 14, the second sub-channel layer 1082 is grown at the second cavity 1072, an inner sidewall of the first electrode layer 120, and an inner sidewall of the second electrode layer 140 through epitaxy. The second sub-channel layer 1082 includes a first channel part 1082-1 located in the second cavity 1072 and a second channel part 1082-2 located outside the second cavity 1072. The first channel part 1082-1 is conformed to the second cavity 1072, that is, the first channel part 1082-1 also includes a convex facing the proximal side.

Figure 10:
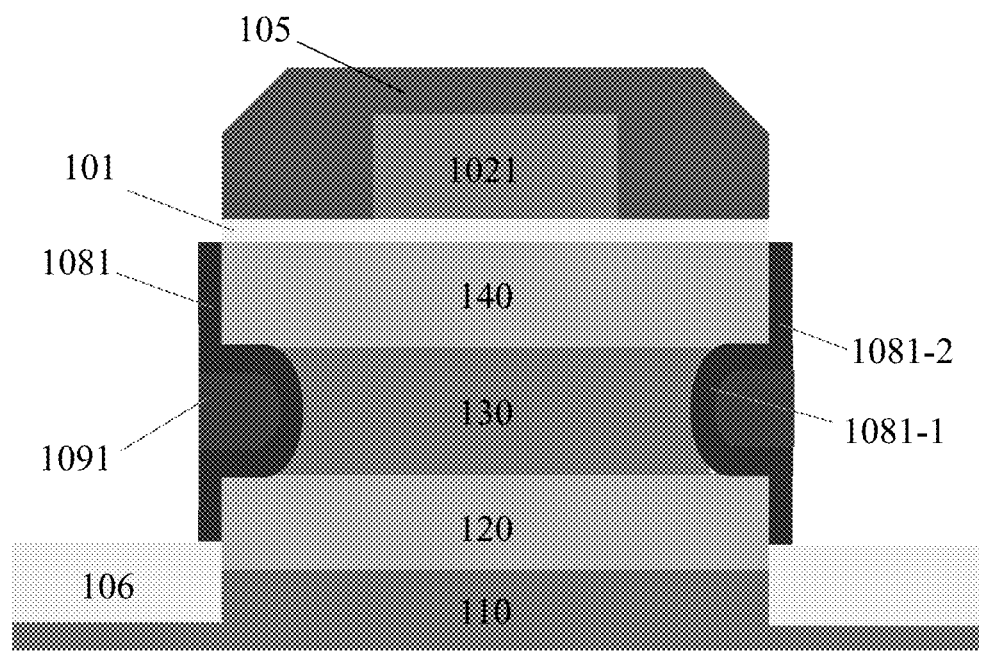
Figure 15:
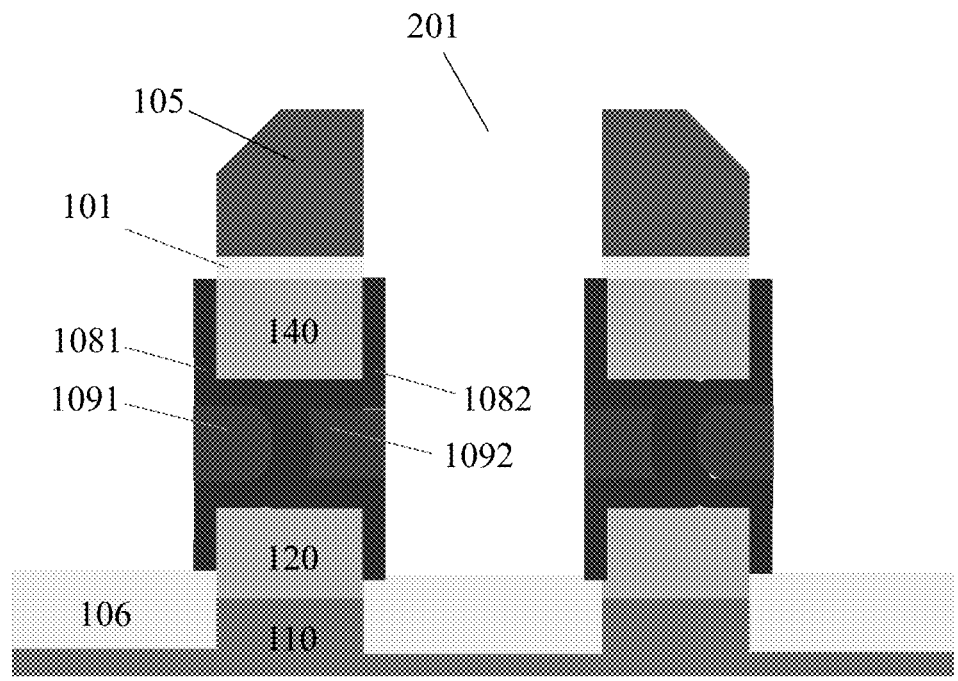

In step S104, the first channel part is filled with a dummy gate layer. Reference is made to FIGS. 10 and 15.

In an embodiment, the cavity has a vacant space after being filled with the first channel part of the channel layer. The dummy gate layer may be formed on the first channel part, and a sidewall of the dummy gate layer is flush with a sidewall of the second channel part. The dummy gate layer includes a first dummy gate layer 1091 and a second dummy gate layer 1092. The first dummy gate layer 1091 is located at a dismal side of the second dummy gate layer 1092.

As shown in FIG. 10, the first channel part 1081-1 within the first cavity 1071 is further filled with the first dummy gate layer 1091. As shown in FIG. 15, the first channel part 1082-1 within the second cavity 1072 is further filled with the second dummy gate layer 1092.

During the filling, a material of the dummy gate layer may be deposited and then etched, and the sidewall of the dummy gate layer is flush with the sidewall of the second channel part. When etching the dummy gate layer, it is necessary to select an etching agent having selectivity against the channel layer, and the channel layer is not damaged during the etching. The dummy gate layer may be made of oxynitride.

In an embodiment, the first cavity 1071 is formed by etching from an outer sidewall of the channel layer. The first sub-channel layer 1081 is grown at the first cavity 1071, the outer sidewall of the first electrode layer 120, and the outer sidewall of the second electrode layer 140 through epitaxy.

Figure 11:
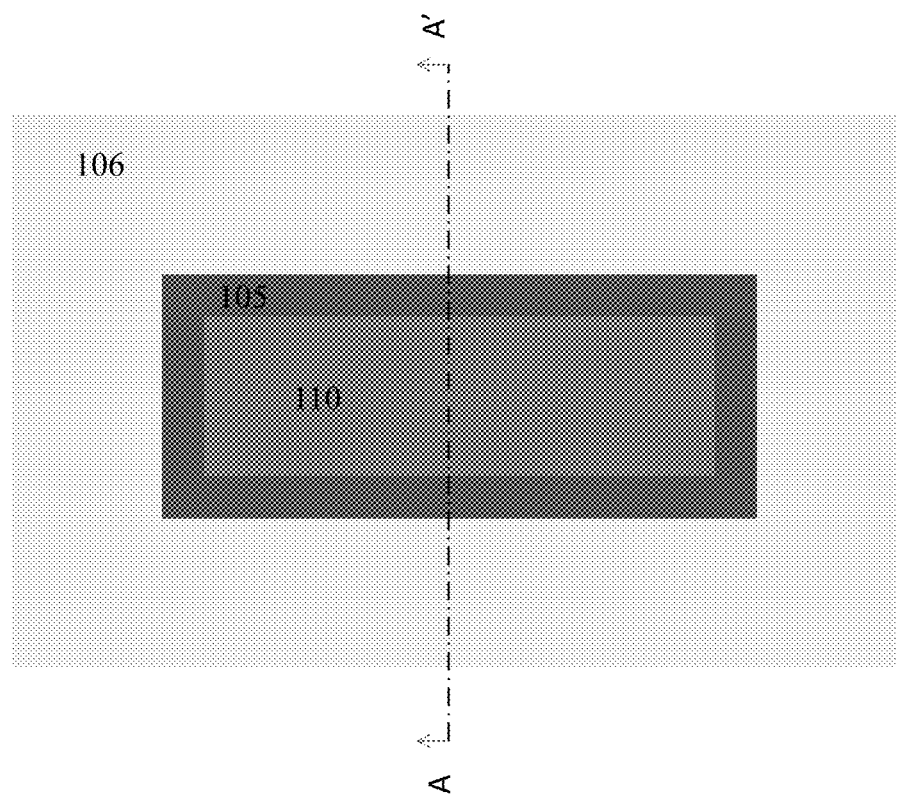
Figure 12:
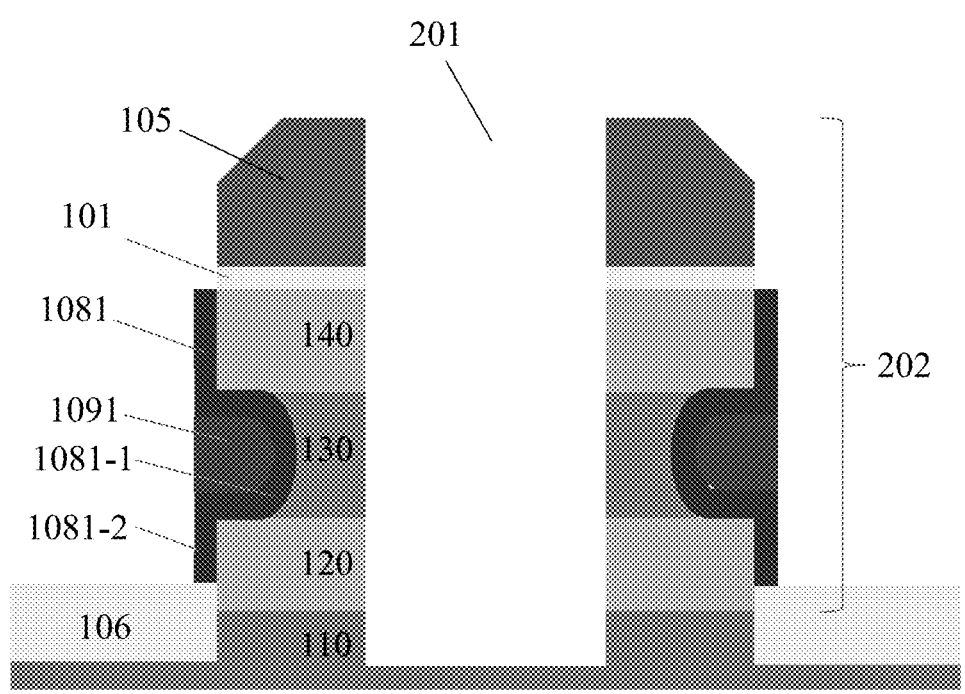

After the first channel part 1081-1 of the first sub-channel layer 1081 is filled with the first dummy gate layer 1091, the dielectric barrier 105, the silicon core region 1021, the etch-stop layer 101, the first electrode layer 120, the semiconductor layer 130, the second electrode layer 140, and a part of the substrate 110 are etched to form an opening 201 running through the dielectric barrier 105, the silicon core region 1021, the etch-stop layer 101, the first electrode layer 120, the semiconductor layer 130, and the second electrode layer 140. The silicon core region 1021 corresponds to the opening 201, that is, the silicon core region 1021 defines a position of the opening 201. A fence structure 202, which is formed from the dielectric barrier 105, the etch-stop layer 101, the first electrode layer 120, the semiconductor layer 130, and the second electrode layer 140 surrounds the opening 201. Reference is made to FIGS. 11 and 12. FIG. 11 is a schematic structural diagram showing a top view of a semiconductor device in a manufacturing process. FIG. 12 is a schematic structural diagram of a cross section of the semiconductor device along direction AA'.

In an embodiment after the opening 201 and the fence structure 202 are formed through etching, the opening 201 is located at a proximal (inner) side of the fence structure 202, and correspondingly the fence structure 202 has a distal (outer) side. The first cavity 1071 is located on at a distal sidewall of the fence structure 202. The first sub-channel layer 1081 and the first dummy gate layer 1091 are located at the distal sidewall of the fence structure 202 and in the first cavity 1071.

Reference is made to FIG. 13. At the proximal side of the fence structure 202, the remained semiconductor layer 130 is etched from a proximal sidewall to form the second cavity 1072 including the convex. The convex in the second cavity 1072 is conformed to the concave in the first cavity 1071. The convex in the second cavity 1072 faces towards the proximal side, and the second cavity 1072 including the convex also has a shape similar to the letter "C". The second cavity 1072 is formed after the first cavity 1071 is filled with the channel layer and the dummy gate layer, and after the opening 201 is formed through etching.

Reference is made to FIG. 14. At the proximal side of the fence structure 202, the second sub-channel layer 1082 is grown formed at the second cavity 1072, the proximal sidewall of the first electrode layer 120, and the proximal sidewall of the second electrode layer 140 through epitaxy in a same process as growing the first sub-channel layer 1081. The second sub-channel layer 1082 includes the first channel part 1082-1 located in the second cavity 1072 and the second channel part 1082-2 located outside the second cavity 1072. The first channel part 1082-1 is conformed to the second cavity 1072, that is, the first channel part 1082-1 also includes a convex facing the proximal side.

Both a thickness of the first sub-channel layer 1081 and a thickness of the second sub-channel layer 1082 may range from 3 nm to 15 nm. The first sub-channel layer 1081 and the second sub-channel layer 1082 may be made of silicon or silicon germanium. In case of the silicon germanium, the mole fraction of germanium ranges from 10% to 30%.

Reference is made to FIG. 15. At the proximal side of the fence structure 202, the first channel part 1082-1 within the second cavity 1072 is filled with the first dummy gate layer 1092. The dummy gate layer may be made of oxynitride.

Figure 16:
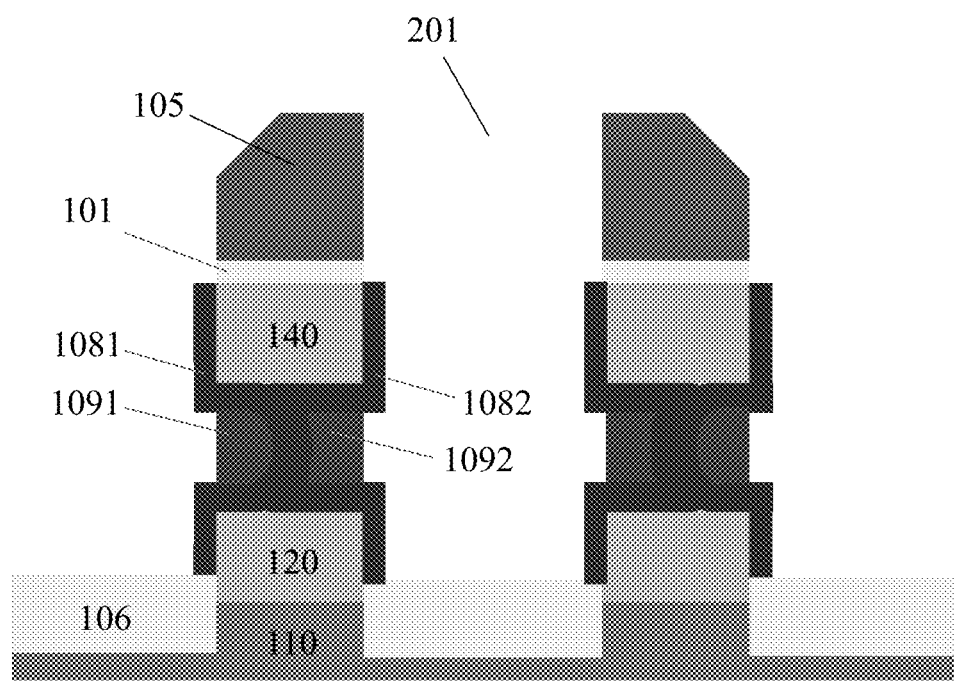

After the second dummy gate layer 1092 is formed, a dielectric material is deposited to cover the semiconductor device completely, and then subject to CMP and etching to from another STI layer 106 in the opening 201. Reference is made to FIG. 16. The dielectric material may be silicon oxide. The etching may be wet etching or dry etching.

In step S105, a part of the dummy gate layer is removed through etching the sidewall of the dummy gate layer. Reference is made to FIG. 16.

In an embodiment, the second channel part of the channel layer, located at both the proximal side and the distal side of the fence structure 202, serves as a mask, and the part of the dummy gate layer is removed through etching the sidewall of the dummy gate layer. In one embodiment, a sidewall of the etched dummy gate layer is flush with the sidewall of the first electrode layer.

As shown in FIG. 16, a part of the first dummy gate layer 1091 and a part of the second dummy gate layer 1092 are removed through isotropic etching on a sidewall of the first dummy gate layer 1091 located at the distal side of the fence structure 202 and a sidewall of the second dummy gate layer 1092 located the inner side of the fence structure 202, respectively. In one embodiment, a sidewall of the etched first dummy gate layer 1091 is flush with the distal sidewall of the first electrode layer 120, and a sidewall of the etched second dummy gate layer 1092 is flush with the proximal sidewall of the first electrode layer 120.

Figure 17:
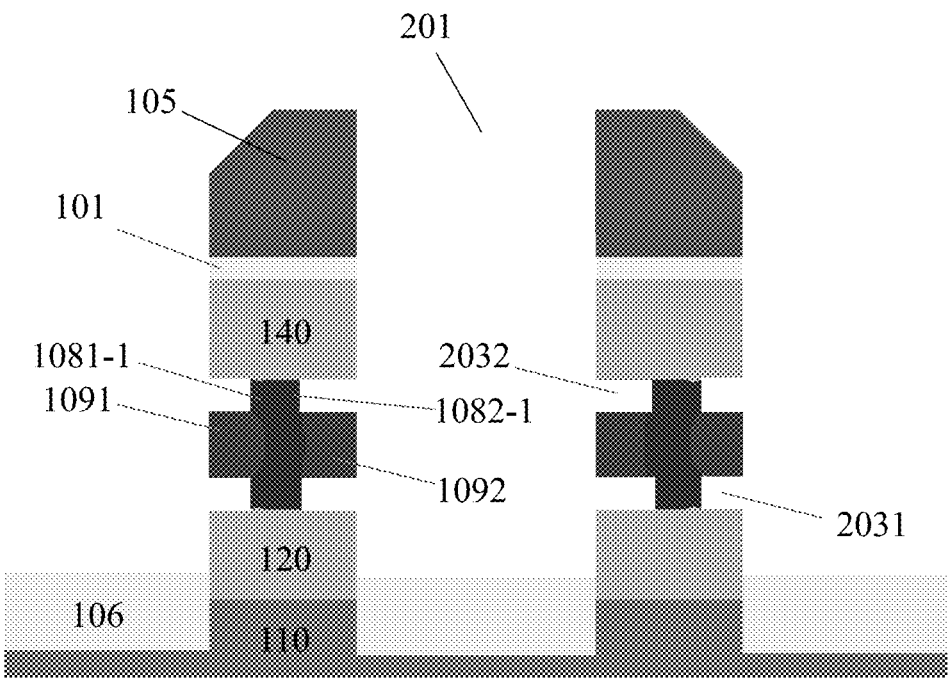

In step S106, the second channel part and the first channel part, which is in contact with an upper surface and a lower surface of the dummy gate layer, are removed. Reference is made to FIG. 17.

In an embodiment, the dummy gate layer serves as a mask, and the second channel part and the first channel part, which is in contact with the upper surface and the lower surface of the dummy gate layer, of the channel layer are removed. A part of the channel layer is retained for forming a recess. The recess is formed by either the first electrode layer 120 or the second electrode layer 140, the remained channel layer, and the dummy gate layer.

The recess includes a first recess 2031 and a second recess 2032. The first recess 2031 is located at a distal side of the second recess 2032. That is, the first recess 2031 is located at the distal side of the fence structure 202, and the second recess 2032 is located at the proximal side of the fence structure 202. Reference is made to FIG. 17.

The second channel part 1081-2, which is located at the distal surface of the fence structure 202, and the first channel part 1081-1, which in contact with an upper surface and a lower surface of the first dummy gate layer 1091, may be removed from the first sub-channel layer 1081 through atomic layer etching. In one embodiment, each first recess 2031 is formed by either the first electrode layer 120 or the second electrode layer 140, the first sub-channel layer 1081 and the first dummy gate layer 1091. Moreover, the second channel part 1082-2, which is located at the proximal side of the fence structure 202, and the first channel part 1082-1, which is in contact with an upper surface and a lower surface of the second dummy gate layer 1092, are removed from the second sub-channel layer 1082 through atomic layer etching. In one embodiment, each second recess 2032 is formed by either the first electrode layer 120 or the second electrode layer 140, the second sub-channel layer 1082, and the second dummy gate layer 1091.

During the above etching, an etching agent having selectively against the first electrode layer 120 and the second electrode layer 140 is selected, and the first electrode layer 120 and the second electrode layer 140 are not damaged when removing the part of the channel layer through etching.

Figure 18:
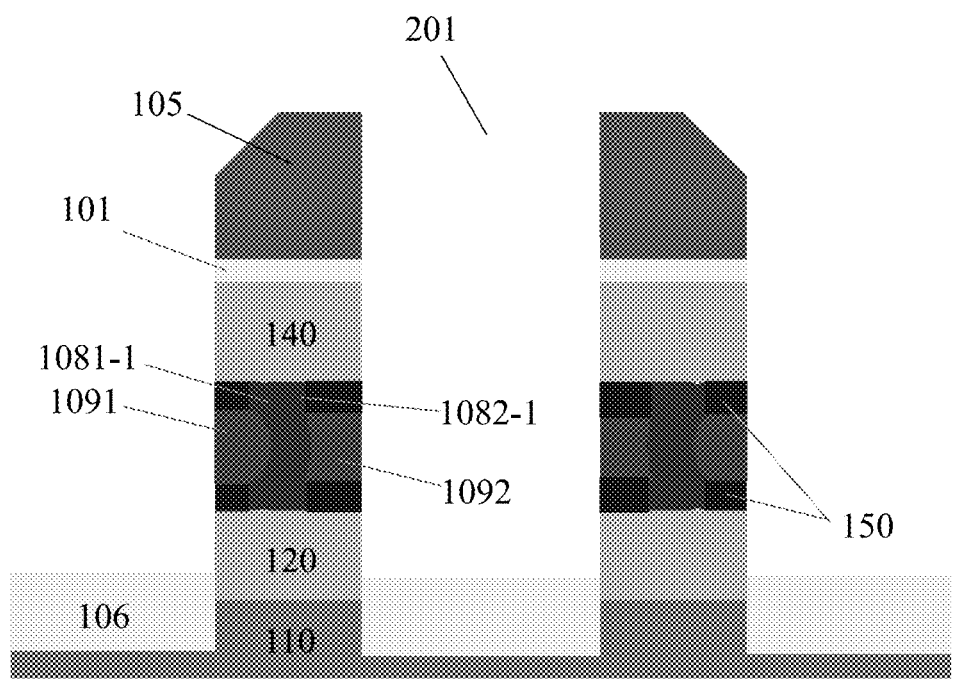

In step S107, the recess is filled with a dielectric material to form an isolation sidewall 150. Reference is made to FIG. 18.

In an embodiment, after the recess is formed, the dielectric material is filled in the recess to form the isolation sidewall 150. The dielectric material may be deposited in the first recess 2031 and the second recess 2032 and then etched to form the isolation sidewall 150. The isolation sidewall 150 is capable to reduce parasitic capacitance of the semiconductor device and improve the performance of the semiconductor device. The dielectric material may be a low-κ material.

During the etching, an etching agent having selectively against the first electrode layer 120, the second electrode layer 140, and other film layers is selected, and the first electrode layer 120, the second electrode layer 140, and other film layers are not damaged when forming the isolation sidewall 150 through etching.

Hence, it is convenient to perform the process of forming the isolation sidewall according to method embodiments of the present disclosure. The isolation sidewall has a controllable structure, which provides a strong basis for improving the performance of the semiconductor device.

Figure 19:
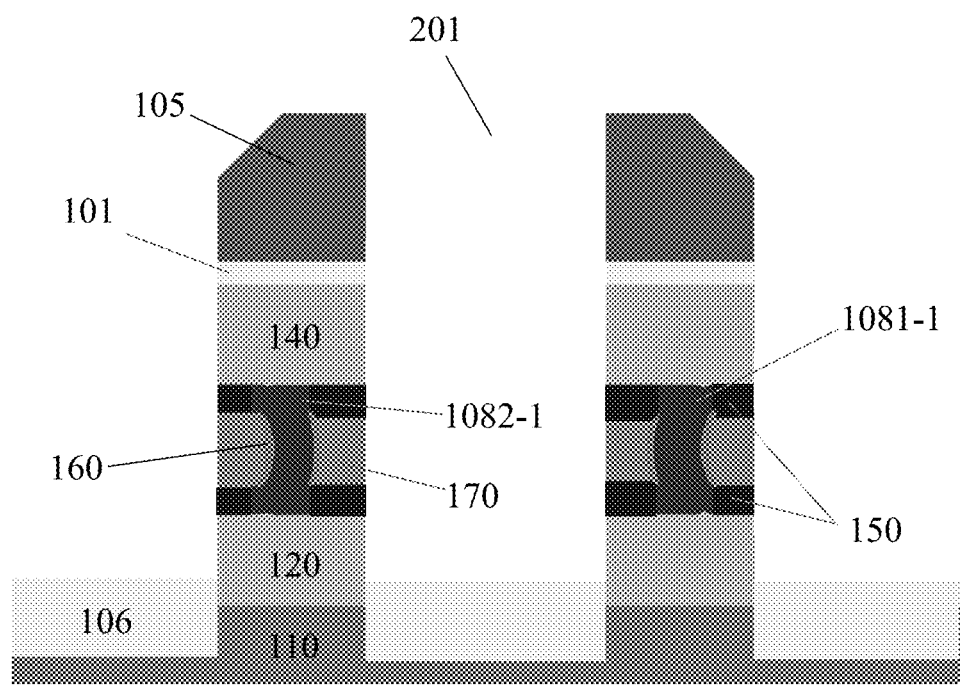

In an embodiment, after the isolation sidewall 150 is formed, the dummy gate layer is removed, and then an interface layer (not shown in the figure) and a high-κ material layer 160 which are conformed to the first channel part are sequentially formed at the first channel part. The interface layer is configured to improve quality of an interface and further improve the performance of the semiconductor device. The interface layer may be made of silicon oxide. After the high-κ material layer 160 is formed, a gate 170 is formed at the first channel part, as shown in FIG. 19. The gate 170 may be made of a material having good conductivity, such as TiN, TaN and W.

Figure 20:
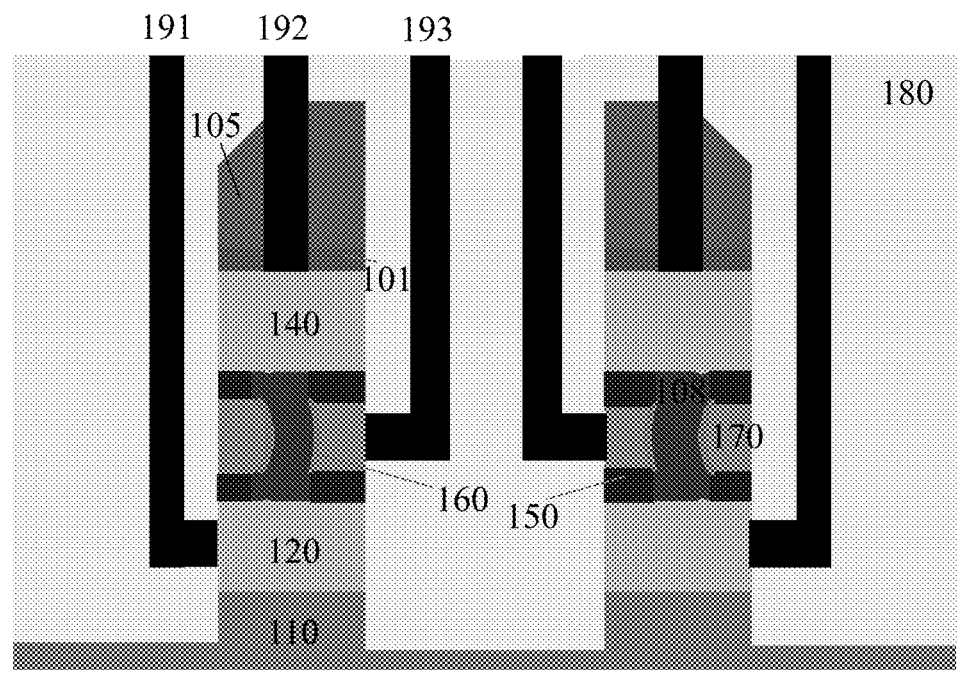

In an embodiment, an isolation layer 180 is formed. The isolation layer 180 is located on the substrate 110 and surrounds film layers including, for example, the first electrode layer 120, the channel layer, the gate 170, the second electrode layer 140, the etch-stop layer 101, and the dielectric barrier 105, and to isolate and protect the device. The isolation layer 180 may be made of a dielectric material having good insulation, such as silicon oxide. A first contact 191, a second contact 192, and a gate contact 193 are formed through through-hole processing. These contacts run through the isolation layer 180, and are electrically connected with the first electrode layer 120, the second electrode layer 140, and the gate 170, respectively. Reference is made to FIG. 20.

In summary, the method for manufacturing the semiconductor device is provided according to embodiments of the present disclosure. The first electrode layer, the semiconductor layer including at least germanium, and the second electrode layer are formed at the side of the substrate in the above-listed sequence. The first electrode layer serves as one of the source layer and the drain layer, and the second electrode layer serves as another of the source layer and the drain layer. Then, the part of the semiconductor layer is removed through etching the sidewall of the semiconductor layer to form the cavity. The cavity includes the concave facing a distal side, that is, the cavity opens toward outside. Afterwards, the channel layer is formed at the cavity, the sidewall of the first electrode layer, and the sidewall of the second electrode layer. The channel layer includes the first channel part located in the cavity and the second channel part located outside the cavity, and the first channel part is conformed to the cavity, that is, the first channel part also includes a concave. The first channel part is filled with the dummy gate layer, and the sidewall of the dummy gate layer is flush with the sidewall of the second channel part. Then, the part of the dummy gate layer is removed through etching the sidewall of the dummy gate layer with the second channel part serving as a shield, and the sidewall of the etched dummy gate layer is flush with the sidewall of the first electrode layer. Afterwards, the second channel part and the first channel part, which is in contact with the upper surface and the lower surface of the dummy gate layer, are removed to form the recess. The recess is formed by either the first electrode layer or the second electrode layer, the channel layer, and the dummy gate layer. The recess is filled with the dielectric material to form the isolation sidewall. The formed isolation sidewall is capable to reduce parasitic capacitance of the semiconductor device and improve a performance of the semiconductor device.

Based on the forgoing method embodiments, a semiconductor device is further provided according to an embodiment of the present disclosure. Reference is made to FIG. 20, which shows a schematic structural diagram of a semiconductor device according to an embodiment of the present disclosure.

In an embodiment, a semiconductor device includes a substrate 110, a first electrode layer 120, a functional layer, and a second electrode layer 140 that are sequentially stacked, and further includes an opening. The opening runs through the first electrode layer 120, the functional layer, and the second electrode layer 140 and reaches the substrate, and is surrounded by a fence structure formed by the first electrode layer 120, the functional layer, and the second electrode layer 140.

The first electrode layer 120 is located at a side of the substrate 110.

The functional layer is located at a side of the first electrode layer 120 away from the substrate 110. The functional layer includes a channel region 108, a gate region 170, and an isolation sidewall region 150. The channel region 108 includes a concave region facing a distal side. The gate region 170 is located at two sides of the concave region. The isolation sidewall region 150 is located both above and below the gate region 170.

The second electrode layer 140 is located at a side of the functional layer away from the substrate 110. The first electrode layer 120 serves as one of a source layer and a drain layer. The second electrode layer 140 serves as another of the source layer and the drain layer.

In an embodiment, the semiconductor device further includes an isolation layer 180, a first contact 191, a second contact 192, and a gate contact 193. Reference is made to FIG. 20.

The isolation layer 180 is located on the substrate 110, and surrounds film layers including, for example, the first electrode layer 120, a channel layer, a gate 170, the second electrode layer 140, an etch-stop layer 101, and a dielectric barrier 105, and to isolate and protect the device.

The first contact 191, the second contact 192, and the gate contact 193 run through the isolation layer 180, and are electrically connected with the first electrode layer 120, the second electrode layer 140, and the gate 170, respectively. In one embodiment, the first electrode layer 120, the second electrode layer 140, and the gate 170 are electrically introduced out of the device.

In an embodiment, the second electrode layer 140 is covered with the etch-stop layer 101 and the dielectric barrier 105.

In an embodiment, an interface layer (not illustrated in FIG. 20) and a high-K material layer 160 are located between the gate region 170 and the channel region 108.

The embodiments of the present disclosure are described in a progressive manner, and each embodiment places emphasis on the difference from other embodiments. Therefore, one embodiment can refer to other embodiments for the same or similar parts. Since the devices disclosed in the embodiments corresponds to the methods disclosed in the embodiments, the description of the devices is simple, and reference may be made to the relevant part of the methods Processes or structures in the drawings are described with different emphases. A part that is not described in detail in a process or a structure may refer to relevant description for another process or another structure.

The foregoing embodiments are only some embodiments of the present disclosure. The embodiments according to the disclosure are disclosed above, and are not intended to limit the present disclosure. With the method and content disclosed above, and can make some variations and improvements to the embodiments the present disclosure, or make some equivalent variations on the embodiments without departing from the scope of the embodiments of the present disclosure. All simple modifications, equivalent variations and improvements made based on the embodiments of the present disclosure without departing the content of the embodiments of the present disclosure fall within the protection scope of the embodiments of the present disclosure.

On a basis of the above-described embodiments, other embodiments may be further provided according to the present disclosure by combining the foregoing embodiments.

The invention claimed is:

1. A method for manufacturing a semiconductor device, comprising:

forming a first electrode layer, a semiconductor layer comprising at least germanium, and a second electrode layer at a side of a substrate in the above-listed sequence, wherein the first electrode layer serves as one of a source layer and a drain layer, and the second electrode layer serves as another of the source layer and the drain layer;

removing a part of the semiconductor layer through etching a sidewall of the semiconductor layer to form a cavity, wherein the cavity comprises a concave facing a distal side of the semiconductor device;

forming a channel layer at the cavity, a sidewall of the first electrode layer, and a sidewall of the second electrode layer, wherein the channel layer comprises a first channel part located in the cavity and a second channel part located outside the cavity, and the first channel part is conformed to the cavity;

filling the first channel part with a dummy gate layer, wherein a sidewall of the dummy gate layer is flush with a sidewall of the second channel part;

removing a part of the dummy gate layer through etching the sidewall of the dummy gate layer, wherein a sidewall of the etched dummy gate layer is flush with the sidewall of the first electrode layer;

removing the second channel part and the first channel part that is in contact with an upper surface and a lower surface of the dummy gate layer to form a recess, wherein the recess is formed by either the first electrode layer or the second electrode layer, the channel layer, and the dummy gate layer; and filling the recess with a dielectric material to form an isolation sidewall.

2. The method according to claim 1, wherein:
the cavity comprises a first cavity and a second cavity, and the first cavity is located at a distal side, with respect to the semiconductor device, of the second cavity;
the channel layer comprises a first sub-channel layer and a second sub-channel layer, and the first sub-channel layer is located at a distal side, with respect to the semiconductor device, of the second sub-channel layer;
removing the part of the semiconductor layer through etching the sidewall of the semiconductor layer comprises:
removing the part of the semiconductor layer through atomic etching on a distal sidewall of the semiconductor layer, to form the first cavity including the concave facing a distal side; and
removing a part of the etched semiconductor layer through atomic etching on an proximal sidewall of the semiconductor layer, to form the second cavity including a convex, wherein the convex is conformed to the concave; and
forming the channel layer at the cavity, the sidewall of the first electrode layer, and the sidewall of the second electrode layer comprises:
growing the first sub-channel layer at the first cavity, a distal sidewall of the first electrode layer, and a distal sidewall of the second electrode layer through epitaxy; and
growing the second sub-channel layer at the second cavity, a proximal sidewall of the first electrode layer, and a proximal sidewall of the second electrode layer through epitaxy.

3. The method according to claim 2, wherein:
the dummy gate layer comprises a first dummy gate layer and a second dummy gate layer, and the first dummy gate layer is located at a distal side, with respect to the semiconductor device, of the second dummy gate layer;
the recess comprises a first recess and a second recess, and the first recess is located at a distal side, with respect to the semiconductor device, of the second recess;
filling the first channel part with the dummy gate layer comprises:
filling the first channel part at the first cavity with the first dummy gate layer, and
filling the first channel part at the second cavity with the second dummy gate layer;
removing the part of the dummy gate layer through etching the sidewall of the dummy gate layer comprises: removing a part of the first dummy gate layer and a part of the second dummy gate layer through isotropic etching on a sidewall of the first dummy gate layer and a sidewall of the second dummy gate layer;
removing the second channel part and the first channel part that is in contact with the upper surface and the lower surface of the dummy gate layer comprises:
removing the second channel part in the first sub-channel layer and the first channel part that is in contact with an upper surface and a lower surface of the first dummy gate layer through atomic layer etching to form the first recess, wherein the first recess is formed by either the first electrode layer or the second electrode layer, the first sub-channel layer, and the first dummy gate layer; and
removing the second channel part in the second sub-channel layer and the first channel part that is in contact with an upper surface and a lower surface of the second dummy gate layer through atomic layer etching to form the second recess, wherein the second recess is formed by either the first electrode layer or the second electrode layer, the second sub-channel layer, and the second dummy gate layer; and
filling the recess with the dielectric material comprises: depositing the dielectric material in the first recess and the second recess to form the isolation sidewall.

4. The method according to claim 3, wherein before removing the part of the etched semiconductor layer through atomic layer etching on the proximal sidewall of the semiconductor layer, the method further comprises:
forming an opening running through the first electrode layer, the semiconductor layer, and the second electrode layer, wherein the opening is surrounded by a fence structure formed from the first electrode layer, the semiconductor layer, and the second electrode layer.

5. The method according to claim 4, wherein before removing the part of the semiconductor layer through etching the sidewall of the semiconductor layer, the method further comprises:
forming an etch-stop layer, a silicon layer, and a dielectric layer on the second electrode layer in the above-listed sequence;
processing the silicon layer and the dielectric layer to form a top structure, wherein the top structure comprises a silicon core region and a dielectric barrier surrounding the silicon core region, and the silicon core region corresponds to the opening;
wherein forming the opening running through the first electrode layer, the semiconductor layer, and the second electrode layer comprises:
forming the opening running through the dielectric barrier, the silicon core region, the etch-stop layer, the first electrode layer, the semiconductor layer, and the second electrode layer, wherein the fence structure is formed from the dielectric barrier, the etch-stop layer, the first electrode layer, the semiconductor layer, and the second electrode layer.

6. The method according to claim 1, wherein after filling the recess with the dielectric material to form the isolation sidewall, the method further comprises:
removing the dummy gate layer, and
forming a gate at the first channel part.

7. The method according to claim 6, wherein before forming the gate at the first channel part, the method further comprises:
forming an interface layer and then a high-K material layer at the first channel part, wherein both the interface layer and the high-K material layer are conformed to the first channel part.

8. The method according to claim 1, wherein the semiconductor layer comprising at least germanium is made of germanium or silicon germanium.

9. The method according to claim 1, wherein the dielectric material is a low-κ material.

10. A semiconductor device, comprising:
a substrate, a first electrode layer, a functional layer and a second electrode layer that are sequentially stacked; and
an opening, running through the first electrode layer, the functional layer, and the second electrode layer and reaching the substrate, wherein the opening is surrounded by a fence structure formed by the first electrode layer, the functional layer, and the second electrode layer; wherein:
the first electrode layer is located at a side of the substrate;
the functional layer is located at a side of the first electrode layer away from the substrate, the functional layer comprises a channel, a gate, and an isolation sidewall, the channel comprises a concave facing a distal side, the gate is located at both a distal side and a proximal side, with respect to the semiconductor device, of the channel, and the isolation sidewall is located both above and below the gate; and the second electrode layer is arranged at a side of the functional layer away from the substrate, the first electrode layer serves as one of a source layer and a drain layer, and the second electrode layer serves as another of the source layer and the drain layer.

11. The semiconductor device according to claim 10, further comprising an isolation layer, a first contact, a second contact, and a gate contact, wherein:

the isolation layer is located on the substrate and surrounds the first electrode layer, the channel, the gate, and the second electrode layer; and the first contact, the second contact, and the gate contact run through the isolation layer, and are electrically connected with the first electrode layer, the second electrode layer, and the gate, respectively.

12. The semiconductor device according to claim 10, further comprising an etch-stop layer and a dielectric barrier, wherein the second electrode layer is covered with the etch-stop layer and the dielectric barrier.

13. The semiconductor device according to claim 10, further comprising an interface layer and a high-k material layer, which are located between the gate and the channel.

* * * * *